(12) United States Patent
Kanari

(10) Patent No.: US 9,018,981 B2
(45) Date of Patent: Apr. 28, 2015

(54) LATCH CIRCUIT AND CLOCK CONTROL CIRCUIT

(75) Inventor: Katsunao Kanari, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 102 days.

(21) Appl. No.: 13/494,614

(22) Filed: Jun. 12, 2012

(65) Prior Publication Data

US 2012/0249181 A1    Oct. 4, 2012

Related U.S. Application Data

(63) Continuation of application No. PCT/JP2009/007039, filed on Dec. 18, 2009.

(51) Int. Cl.
*H03K 19/096*   (2006.01)
*H03K 3/356*    (2006.01)
*H03K 3/012*    (2006.01)

(52) U.S. Cl.
CPC .......... *H03K 3/356147* (2013.01); *H03K 3/012* (2013.01)

(58) Field of Classification Search
USPC ................ 326/95, 93, 98, 114; 327/141–155, 327/185–230
See application file for complete search history.

(56) References Cited

U.S. PATENT DOCUMENTS 5,656,962 A  *  8/1997  Banik ........................... 327/202
6,630,853 B1   10/2003  Hamada
6,831,496 B2 *  12/2004  Gardner ........................ 327/202
8,143,919 B2 *  3/2012  Kurokawa ..................... 326/114
2006/0267627 A1  11/2006  Teh et al.
2008/0028343 A1 *  1/2008  Sato et al. .......................... 716/2
2008/0180159 A1   7/2008  Campbell et al.
2009/0267649 A1  10/2009  Saint-Laurent et al.

FOREIGN PATENT DOCUMENTS

| EP | 1940027 A2 | 7/2008 |
|---|---|---|
| JP | 04-298115 | 10/1992 |
| JP | 04-306013 | 10/1992 |
| JP | 09-214297 | 8/1997 |
| JP | 10-290143 | 10/1998 |
| JP | 11-340795 | 12/1999 |
| JP | 2000-13195 | 1/2000 |
| JP | 2001-308686 | 11/2001 |
| JP | 2004-056667 | 2/2004 |

OTHER PUBLICATIONS

Japanese Office Action mailed May 7, 2013 for corresponding Japanese Application No. 2011-545861.

(Continued)

*Primary Examiner* — James H Cho
(74) *Attorney, Agent, or Firm* — Staas & Halsey LLP

(57) ABSTRACT

A latch circuit includes a latch unit and a clock propagation suppressing unit. The latch circuit holds and outputs input data of 0 or 1. The clock propagation suppressing unit compares the input data input to the latch unit with output data output from the latch unit. When it is detected that the input data matches the output data at 0, or that the input data matches the output data at 1, an externally input clock signal is prevented from propagating to the latch unit.

3 Claims, 23 Drawing Sheets

(56) References Cited

OTHER PUBLICATIONS

Written Opinion of the International Searching Authority mailed Jan. 19, 2010 (English Translation mailed Jul. 19, 2012) issued in corresponding International Patent Application No. PCT/JP2009/007039.
International Preliminary Report on Patentability mailed Jun. 28, 2012 issued in corresponding International Patent Application No. PCT/JP2009/007039.
Korean Office Action mailed Jul. 3, 2013 in corresponding Korean Application No. 10-2012-7017327.
Tomas Lang et al., "Individual Flip-Flops with Gated Clocks for Low Power Datapaths", IEEE Transactions on Circuits and System II: Analog and Digital Signal Processing, vol. 44, No. 6, Jun. 1997, pp. 507-516.
Extended European Search Report mailed Jan. 24, 2014 in corresponding European Application No. 09852246.9.
Japanese Office Action mailed Jun. 3, 2014 in corresponding Japanese Patent Application No. 2013-142933.

* cited by examiner

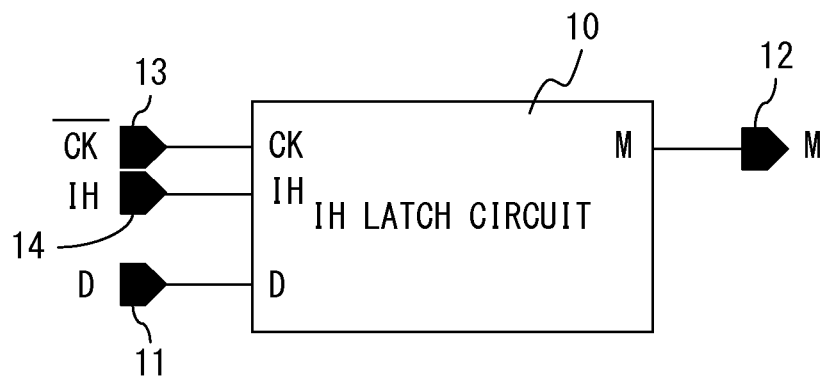
F I G. 1

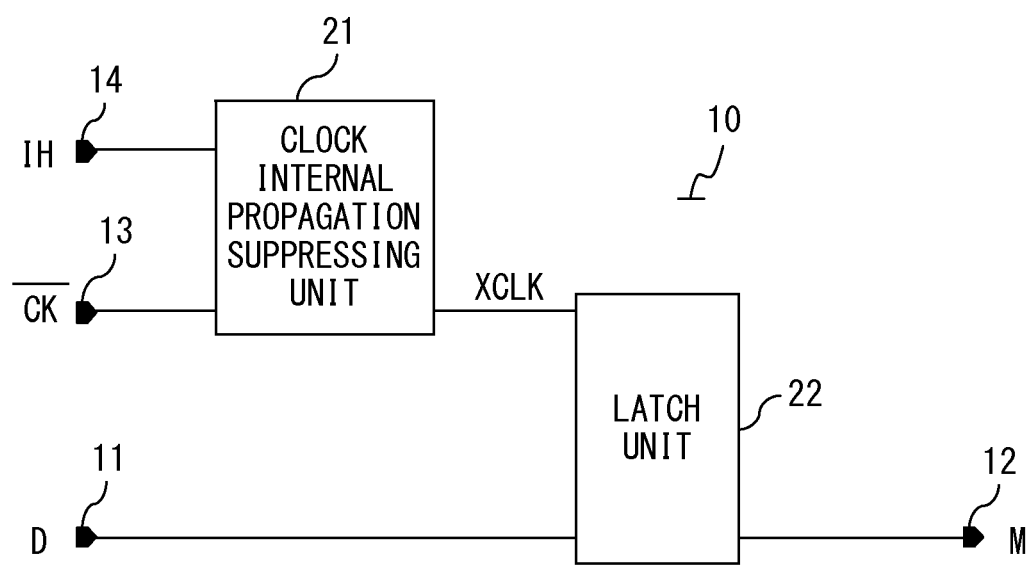
F I G. 2

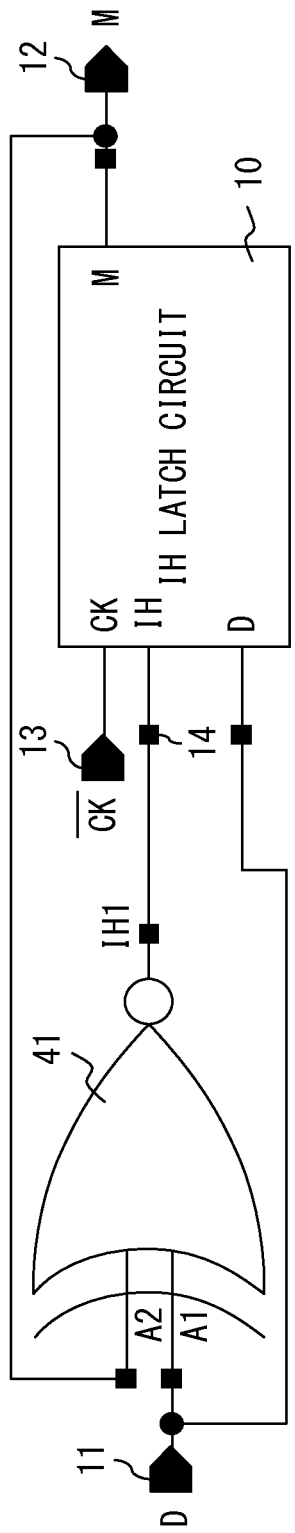
F I G. 4

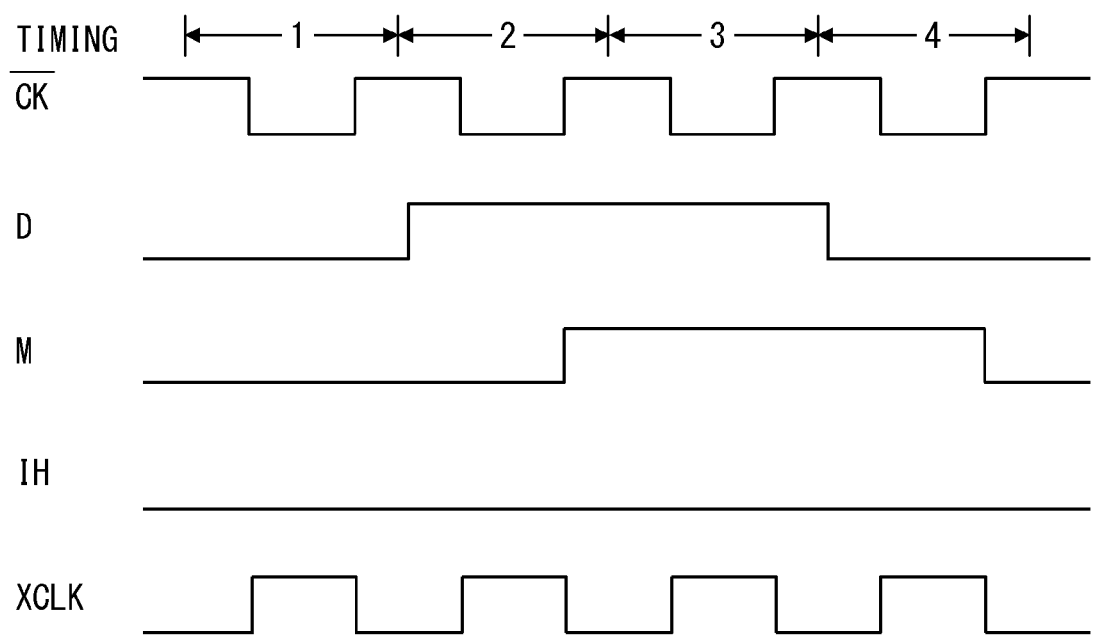
F I G. 5

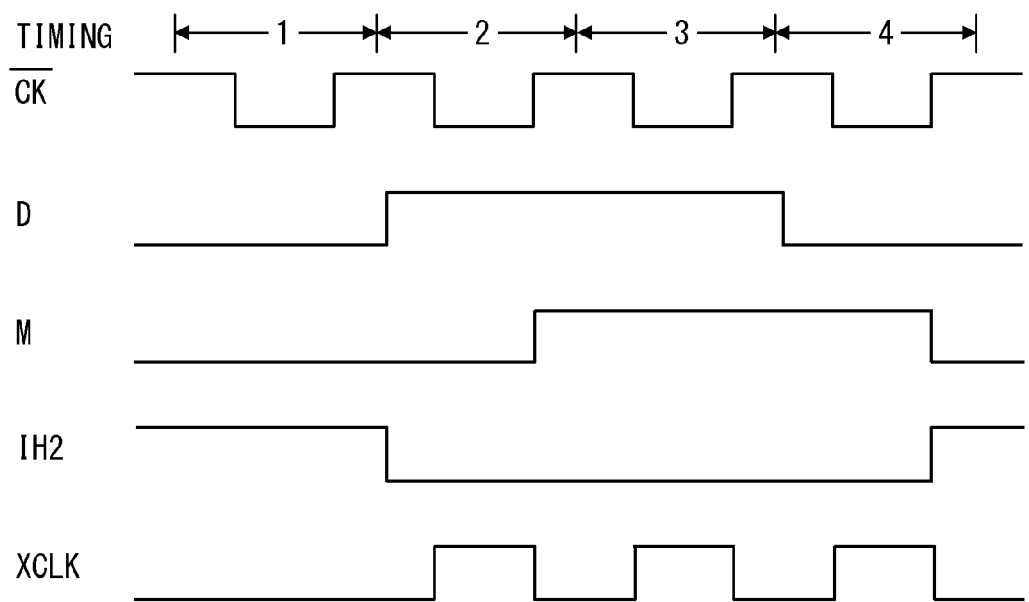
F I G. 1 1

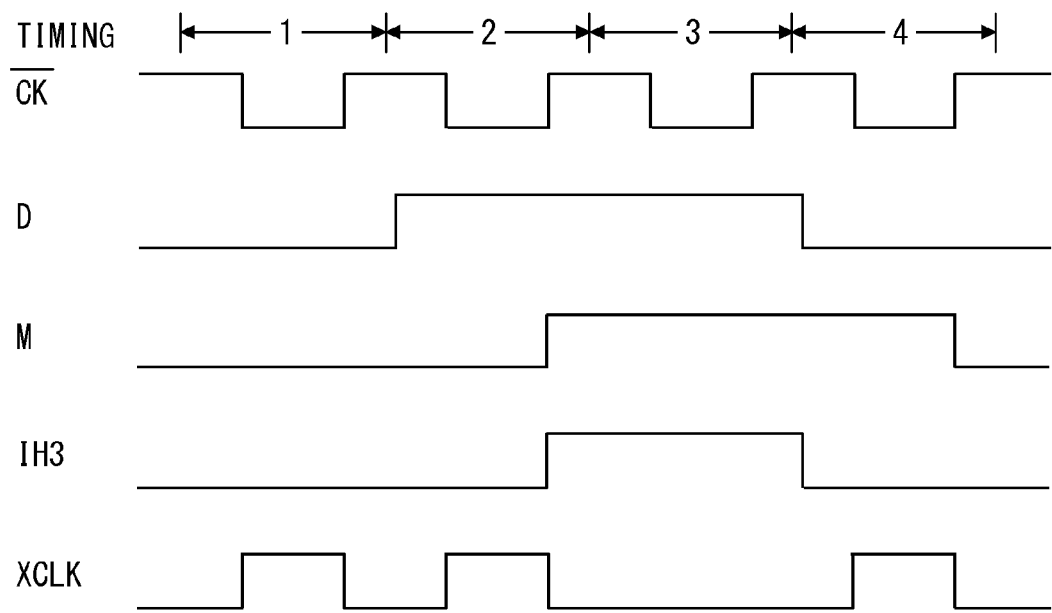
F I G. 1 4

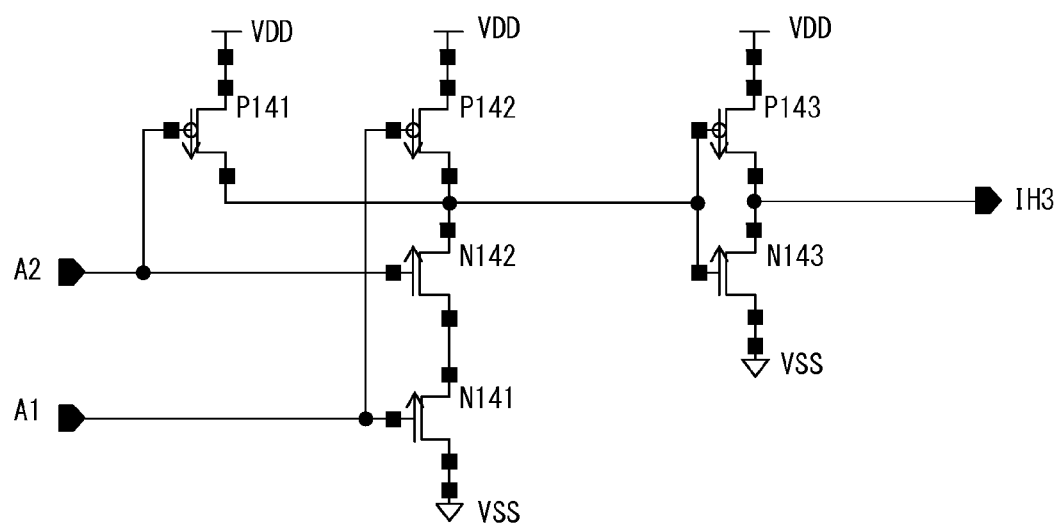
F I G. 15

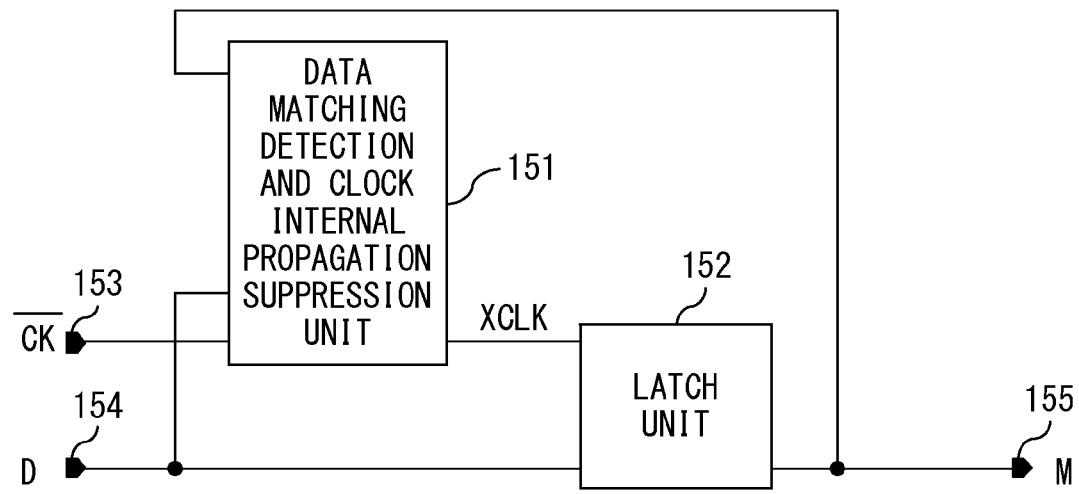
F I G. 1 6

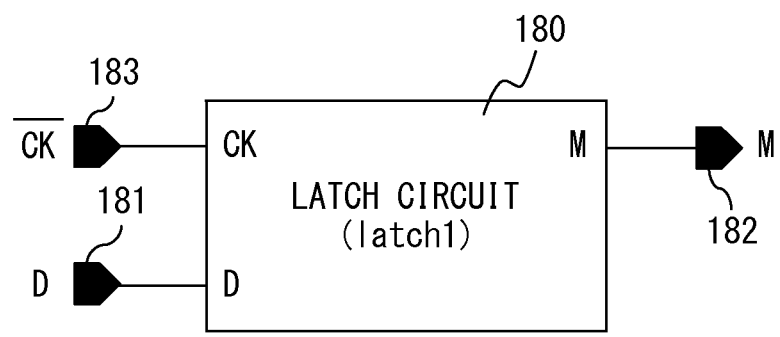
F I G. 19

| OPERATION PATTERN | (1) 0 → 0 | | (2) 0 → 1 | | (3) 1 → 1 | | (4) 1 → 0 (μW) | |
|---|---|---|---|---|---|---|---|---|
| HI=0 (FIG. 1) | 9.3160 | 511.0% | 26.9300 | 54.1% | 9.0190 | 446.3% | 25.7300 | 58.4% |
| ENOR (FIG. 4) | 1.8230 | 100.0% | 49.7700 | 100.0% | 2.0210 | 100.0% | 44.0400 | 100.0% |
| NOR (CIRCUIT EXAMPLE 1) | 1.2780 | 70.1% | 33.5100 | 67.3% | 9.1620 | 453.3% | 31.4700 | 71.5% |
| AND (CIRCUIT EXAMPLE 2) | 9.5990 | 526.5% | 39.2900 | 78.9% | 1.5930 | 78.8% | 32.8200 | 74.5% |
| latch0 (CIRCUIT EXAMPLE 3) | 1.3950 | 76.5% | 30.1600 | 60.6% | 8.7970 | 435.3% | 31.8600 | 72.3% |
| latch1 (CIRCUIT EXAMPLE 4) | 9.1050 | 499.5% | 31.3700 | 63.0% | 1.6170 | 80.0% | 26.5800 | 60.4% |

FIG. 21

|  | AVERAGE (= OPERATION RATE 50%) | 0 → 0 97% | | 1 → 1 97% | (μW) |
|---|---|---|---|---|---|
| HI=0 (FIG. 1) | 17.7488 | 72.7% | 9.6533 | 354.0% | 9.3682 | 321.2% |
| ENOR (FIG. 4) | 24.4135 | 100.0% | 2.7266 | 100.0% | 2.9167 | 100.0% |
| NOR (CIRCUIT EXAMPLE 1) | 18.8550 | 77.2% | 1.9811 | 72.7% | 9.5497 | 327.4% |
| AND (CIRCUIT EXAMPLE 2) | 20.8255 | 85.3% | 10.0481 | 368.5% | 2.3623 | 81.0% |
| latch0 (CIRCUIT EXAMPLE 3) | 18.0530 | 73.9% | 2.0613 | 75.6% | 9.1672 | 314.3% |
| latch1 (CIRCUIT EXAMPLE 4) | 17.1680 | 70.3% | 9.4275 | 345.8% | 2.2390 | 76.8% |

FIG. 22

| type | ⟨1⟩ D=0, M=0 | | ⟨2⟩ D=1, M=0 | | ⟨3⟩ D=1, M=1 | | ⟨4⟩ D=0, M=1 | | AVERAGE (μW) | |
|---|---|---|---|---|---|---|---|---|---|---|
| HI=0 (FIG. 1) | 1.2020 | 85.6% | 1.2020 | 84.7% | 0.9445 | 71.3% | 0.9445 | 72.0% | 1.0733 | 78.6% |
| ENOR (FIG. 4) | 1.4050 | 100.0% | 1.4190 | 100.0% | 1.3240 | 100.0% | 1.3110 | 100.0% | 1.3648 | 100.0% |
| NOR (CIRCUIT EXAMPLE 1) | 0.7987 | 56.8% | 0.7213 | 50.8% | 1.1750 | 88.7% | 1.1030 | 84.1% | 0.9495 | 69.6% |
| AND (CIRCUIT EXAMPLE 2) | 1.5790 | 112.4% | 1.5790 | 111.3% | 1.1300 | 85.3% | 0.6498 | 49.6% | 1.2345 | 90.5% |
| latch0 (CIRCUIT EXAMPLE 3) | 0.8342 | 59.4% | 0.9370 | 66.0% | 0.9575 | 72.3% | 0.9533 | 72.7% | 0.9205 | 67.4% |
| latch1 (CIRCUIT EXAMPLE 4) | 1.2410 | 88.3% | 1.2660 | 89.2% | 0.7228 | 54.6% | 0.7315 | 55.8% | 0.9903 | 72.6% |

FIG. 23

LATCH CIRCUIT AND CLOCK CONTROL CIRCUIT

CROSS-REFERENCE TO RELATED APPLICATIONS

This application is a continuation application of International PCT Application No. PCT/JP2009/007039, filed on Dec. 18, 2009, the entire contents of which are incorporated herein by reference.

FIELD

The present invention relates to a latch circuit and a clock control circuit.

BACKGROUND

Conventionally, clock gating has been performed on an unused latch circuit to reduce the power consumption of an electric circuit. The clock gating refers to stopping the supply of a clock to a portion where and when it is known in advance that an input is not changed. However, in a latch circuit to be used, the supply of a clock cannot be stopped, thereby failing in reducing the power consumption.

Then, input/output data signals of the latch circuit are compared with each other, and when they match, the propagation of an input clock into the inner portion of the latch circuit is suppressed. FIG. 1 illustrates an example of a latch circuit having the function of suppressing the clock propagation into the internal portion.

A latch circuit 10 illustrated in FIG. 1 includes a data input terminal 11, a data output terminal 12, a clock input terminal 13 for input of a inverted clock, and an IH (inhibit) pin 14 for input of a control signal for suppressing the clock propagation in a latch. The latch circuit provided with an IH pin in FIG. 1 is referred to as the IH latch circuit 10.

FIG. 2 is a block diagram of the circuit in FIG. 1. The clock input terminal 13 and the IH pin 14 are connected to a clock internal propagation suppressing unit 21, and an internal clock signal XCLK for which the propagation control of a clock has been performed by the clock internal propagation suppressing unit 21 is input to a latch unit 22. The latch unit 22 holds an input value outputs it. The internal clock signal XCLK and the data signal from the data input terminal 11 are input to the latch unit 22, and the latch unit 22 outputs the data signal to the data output terminal 12.

FIG. 3 is an example of a detailed configuration of the IH latch circuit 10 illustrated in FIGS. 1 and 2. The circuit includes P-channel MOSFET (P-channel Metal Oxide Semiconductor Field Effect Transistors) P1, P2, P3, P4, P5, P6, P7, and P8, and N-channel MOSFET (N-channel Metal Oxide Semiconductor Field Effect Transistors) N1, N2, n3, N4, N5, N6, N7, and N8. In the descriptions below, the P-channel MOSFET is described as a PMOS transistor, and the N-channel MOSFET is described as an NMOS transistor.

The source terminal of the PMOS transistor P1 is connected to a high-voltage side power supply terminal (VDD), and the gate terminal is connected to the IH pin 14. The source terminal of the PMOS transistor P2 is connected to the drain terminal of the PMOS transistor P1, and the gate terminal is connected to the clock input terminal 13. The source terminal of the NMOS transistor N1 is connected to the low-voltage side power supply terminal (VSS), the gate terminal is connected to the clock input terminal 13, and the drain terminal is connected to the drain terminal of the PMOS transistor P2. The source terminal of the NMOS transistor N2 is connected to the low-voltage side power supply terminal, the gate terminal is connected to the IH pin 14, and the drain terminal is connected to the drain terminals of the PMOS transistor P2 and the NMOS transistor N1.

The portion (enclosed by the dotted lines in FIG. 3) configured by the PMOS transistors P1 and P2 and the NMOS transistors N1 and N2 corresponds to the clock internal propagation suppressing unit 21 in FIG. 2. That is, this portion controls the internal propagation of a clock signal. When the control signal for suppression of the internal propagation of the clock signal (hereafter referred to as an IH signal) indicates a high level (hereafter described by H), the PMOS transistor P1 is placed in the OFF state, the NMOS transistor N2 is placed in the ON state, and the internal clock signal XCLK is constantly placed at the low level (hereafter described by L). That is, when the IH signal indicates H, the propagation of the clock signal from the clock input terminal 13 is suppressed. On the other hand, when the IH signal indicates L, and the inverted clock input from the clock input terminal 13 indicates L, the PMOS transistors P1 and P2 are placed in the ON state, the NMOS transistors N1 and N2 are placed in the OFF state, and the internal clock signal XCLK indicates H. Furthermore, if the IH signal indicates H and the inverted clock input from the clock input terminal 13 indicates H, then the PMOS transistors P1 and P2 are placed in the OFF state, the NMOS transistors N1 and N2 are placed in the ON state, and the internal clock signal XCLK indicates L. Thus, when the IH signal indicates L, the inverted result (signal) of the inverted clock input from the clock input terminal 13 is propagated as the internal clock signal XCLK to the latch unit 22.

The portion corresponding to the latch unit 22 in FIG. 2 is described below.

The source terminal of the PMOS transistor P3 is connected to the high-voltage side power supply terminal, and the internal clock signal XCLK is input to the gate terminal. The source terminal of the NMOS transistor N3 is connected to the low-voltage side power supply terminal, the internal clock signal XCLK is input to the gate terminal, and the drain terminal is connected to the drain terminal of the PMOS transistor P3. The PMOS transistor P3 and the NMOS transistor N3 configure an inverter (negation circuit).

The source terminal of the PMOS transistor P4 is connected to the high-voltage side power supply terminal, and the gate terminal is connected to the data input terminal 11. The source terminal of the NMOS transistor N4 is connected to the low-voltage side power supply terminal, the gate terminal is connected to the data input terminal 11, and the drain terminal is connected to the drain terminal of the PMOS transistor P4. The PMOS transistor P4 and the NMOS transistor N4 configure an inverter.

The source terminal of the PMOS transistor P5 is connected to the drain terminals of the PMOS transistor P4 and the NMOS transistor N4, and the gate terminal is connected to the drain terminals of the PMOS transistor P3 and the NMOS transistor N3. The source terminal of the NMOS transistor N5 is connected to the drain terminals of the PMOS transistor P4 and the NMOS transistor N4, and the internal clock signal XCLK is input to the gate terminal. The PMOS transistor P5 and the NMOS transistor N5 as pass transistors configure a transfer gate 20. When the gate terminal of the PMOS transistor P5 indicates N, and the gate terminal of the NMOS transistor N5 indicates H, a signal obtained by inverting the input data signal input from the data output terminal 12 is output as the data signal PCM1.

The source terminal of the PMOS transistor P6 is connected to the high-voltage side power supply terminal, and the data signal PCM1 is input to the gate terminal. The source terminal of the NMOS transistor N6 is connected to the low-voltage side power supply terminal, the data signal PCM1 is input to the gate terminal, and the drain terminal is connected to the drain terminal of the PMOS transistor P6. The PMOS transistor P6 and the NMOS transistor N6 configure an inverter, invert the data signal PCM1, and outputs the data signal PAM1.

The source terminal of the PMOS transistor P7 is connected to the high-voltage side power supply terminal, and the data signal PAM1 is input to the gate terminal. The source terminal of the NMOS transistor N7 is connected to the low-voltage side power supply terminal, the data signal PAM1 is input to the gate terminal, and the drain terminal is connected to the drain terminal of the PMOS transistor P7. The PMOS transistor P7 and the NMOS transistor N7 configure an inverter, invert the data signal PAM1, and output the data signal PCM1.

The loop portion by two inverter circuits configured by the PMOS transistors P6 and P7 and the NMOS transistors N6 and N7 has the function of holding the latch data.

The source terminal of the PMOS transistor P8 is connected to the high-voltage side power supply terminal, and the data signal PCM1 is input to the gate terminal. The source terminal of the NMOS transistor N8 is connected to the low-voltage side power supply terminal, the data signal PCM1 is input to the gate terminal, and the drain terminal is connected to the drain terminal of the PMOS transistor P8. The PMOS transistor P8 and the NMOS transistor N8 configure an inverter, invert the data signal PCM1, and output it to the data output terminal 12.

The portion configured by the PMOS transistors P3, P4, P5, P6, P7, and P8 and the NMOS transistors N3, N4, N5, N6, and N7 corresponds to the latch unit 22 in FIG. 2.

In the IH latch circuit 10 as illustrated in FIGS. 1 through 3, it is necessary to compare input/output data signals, and input the result to the IH pin 14 as a control signal. In the comparing operation, an ENOR circuit (Exclusive-NOR circuit) and an exclusive-OR circuit (Exclusive-OR circuit)) are used. FIG. 4 is an example of using the ENOR circuit 41 in comparing the input/output data signals.

As illustrated in FIG. 4, the data signal input from the data input terminal 11 of the IH latch circuit 10 illustrated in FIG. 1 and the data signal output to the data output terminal 12 are input to an ENOR circuit 41 for comparison. The result of the data comparison is output to the IH pin 14. The ENOR circuit 41 outputs H if the two input signals match each other, and outputs L if they do not match each other. That is, if the input/output data signals match each other, the H is input to the IH pin 14, and if the input/output data signals do not match each other, the L is input to the IH pin 14. Thus, if the input/output data signals match each other, the internal propagation of the clock of the IH latch circuit 10 is suppressed, and if the input/output data signals do not match each other, the clock is propagated in the IH latch circuit 10.

FIG. 5 is a timing chart of the case in which the IH pin 14 is clipped (pulled down) to L (connected to the low-voltage side power supply terminal), that is, a timing chart indicating the state in which there is no IH pin. FIG. 6 is a timing chart of the case in which the result of inputting the input/output data signals of the IH latch circuit 10 to the ENOR circuit 41 is input to the IH pin 14 as with the circuit illustrated in FIG. 4.

When the IH pin 14 is clipped to L, the clock propagation in the IH latch circuit 10 is not controlled. Therefore, the internal clock signal XCLK is a inverted signal of the signal input to the clock input terminal 13 as illustrated in the timing chart in FIG. 5. On the other hand, when the IH pin 14 is connected to the output of the ENOR circuit 41, the clock propagation in the IH latch circuit 10 is controlled depending on whether or not the input/output data signals of the IH latch circuit 10 match each other. As illustrated in the timing chart in FIG. 6, when the input data signal D and the output data signal M indicate L (in the case of timing 1), and when the input data signal D and the output data signal M indicate H (in the case of timing 3), the IH1 as an output signal from the ENOR circuit 41 indicates H. Thus, the internal clock signal XCLK in the IH latch circuit 10 indicates L. As described above, since the internal propagation of the clock signal can be suppressed when the input/output data signals match in the circuit illustrated in FIG. 4, the power consumption of the IH latch circuit 10 can be reduced.

However, the ENOR circuit 41 for comparison of the input/output data signals requires at least 10 transistors as illustrated in FIG. 7. This implies the problem of a large number of transistors configuring the circuit. In addition, as illustrated in FIG. 7, the input data signal input from the input terminal A2 requires driving two transistors, that is, a PMOS transistor P71 and an NMOS transistor N71. However, the input data signal input from the input terminal A1 requires driving four transistors, that is, PMOS transistors P74 and P75, and NMOS transistors N73 and N74. Thus, the input capacitance (fan in capacitance) driven by an input data signal is approximately double that of the normal circuit, and the corresponding power consumption increases.

DOCUMENTS OF PRIOR ART

Patent Documents

Patent Document 1: Japanese Laid-open Patent Publication No. 10-290143
Patent Document 2: Japanese Laid-open Patent Publication No. 4-86116
Patent Document 3: Japanese Laid-open Patent Publication No. 11-340795
Patent Document 4: Japanese Laid-open Patent Publication No. 2000-77983
Patent Document 5: Japanese Laid-open Patent Publication No. 2006-229745
Patent Document 6: Japanese Laid-open Patent Publication No. 9-214297

SUMMARY

According to an aspect of the invention, a latch circuit includes a latch unit, a data matching detection unit, and a clock propagation suppressing unit. The latch unit holds and outputs input data. The data matching detection unit compares the input data input to the latch unit with the output data output from the latch unit, and detects only that they match at L (0) or that they match at H (1). The clock propagation suppressing unit prevents the clock signal input externally from being propagated to the latch device when data matching is detected as matching the input data and the output data at L (0) or at H (1).

According to the aspect above, by configuring the data matching detection device, which has been conventionally configured by an EOR circuit and an ENOR circuit, by a negative logical sum (NOR) circuit or a logical product (AND) circuit, the number of transistors configuring a circuit can be minimized. Thus, the power consumption can be reduced.

According to an aspect of the invention, a latch circuit includes a latch unit, a data matching detection and clock propagation suppressing unit. The latch unit holds and outputs an input value. The data matching detection and clock propagation suppressing unit compares the input data input to the latch unit with the output data output from the latch unit, and prevents the clock signal externally input only when the matching of the data at L (0) is detected from propagating to the latch unit, or prevents the clock signal externally input only when the matching of the data at H (1) is detected from propagating to the latch unit.

According to the aspect above, the configuration of the circuits of the data matching detection and clock propagation suppressing unit can be optimized, and the number of transistors configuring the circuit can be reduced. Thus, the power consumption can be reduced.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 illustrates an IH latch circuit having an IH pin;

FIG. 2 is a block diagram of the IH latch circuit;

FIG. 4 illustrates a circuit configured by an IH latch circuit and an ENOR circuit;

FIG. 5 is a timing chart of the IH latch circuit when the IH pin is clipped to L;

FIG. 11 is a timing chart of the circuit example 1;

FIG. 14 is a timing chart of the circuit example 2;

FIG. 15 is an example of the detailed configuration of an AND circuit;

FIG. 16 is a block diagram of the embodiment 2 of the present invention;

FIG. 19 is a circuit example 4;

FIG. 21 is a table of the power measured by each operation pattern on the circuit examples 1 through 4 and an example using an ENOR circuit;

FIG. 22 illustrates an example of obtaining average power etc. from the measurement result in FIG. 20; and FIG. 23 is a table of the leakage power measured by each operation pattern on the circuit examples 1 through 4 and an example using an ENOR circuit.

DESCRIPTION OF EMBODIMENTS

The embodiments of the latch circuit and the clock control circuit are described below with reference to the attached drawings. First, the embodiment 1 is described with reference to FIGS. 8 through 15, and then the embodiment 2 is described with reference to FIGS. 16 through 20. Finally, the power consumption of the circuit example disclosed below is studied with reference to FIGS. 21, 22, and 23.

Embodiment 1

Figure 8:
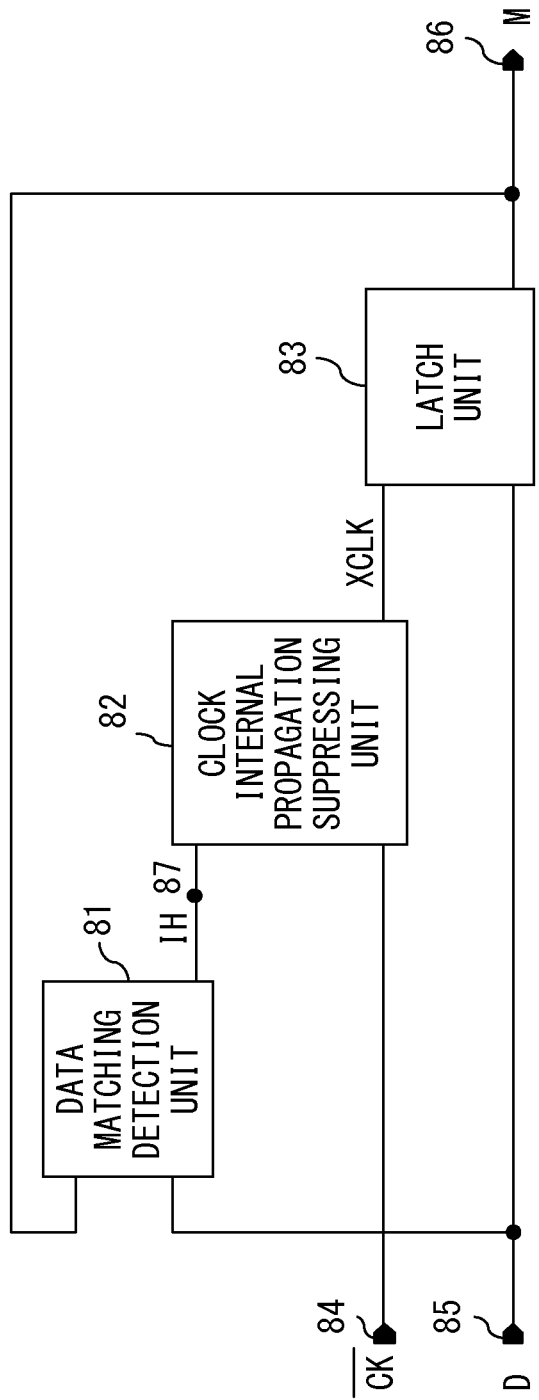
FIG. 8 is a block diagram of the embodiment 1 of the present invention.

FIG. 8 is a block diagram of the latch circuit and the clock control circuit according to the embodiment 1.

The latch circuit according to the embodiment 1 includes a data matching detection unit 81, a clock internal propagation suppressing unit 82, and a latch unit 83. The clock control circuit includes the clock internal propagation suppressing unit 82.

The clock internal propagation suppressing unit 82 and the latch unit 83 have the same operations as the clock internal propagation suppressing unit 21 and the latch unit 22 in FIG. 2, respectively. That is, the clock internal propagation suppressing unit 82 controls the propagation of the clock depending on the output result of the data matching detection unit 81, and the latch unit 83 holds and outputs an input value.

Figure 9:
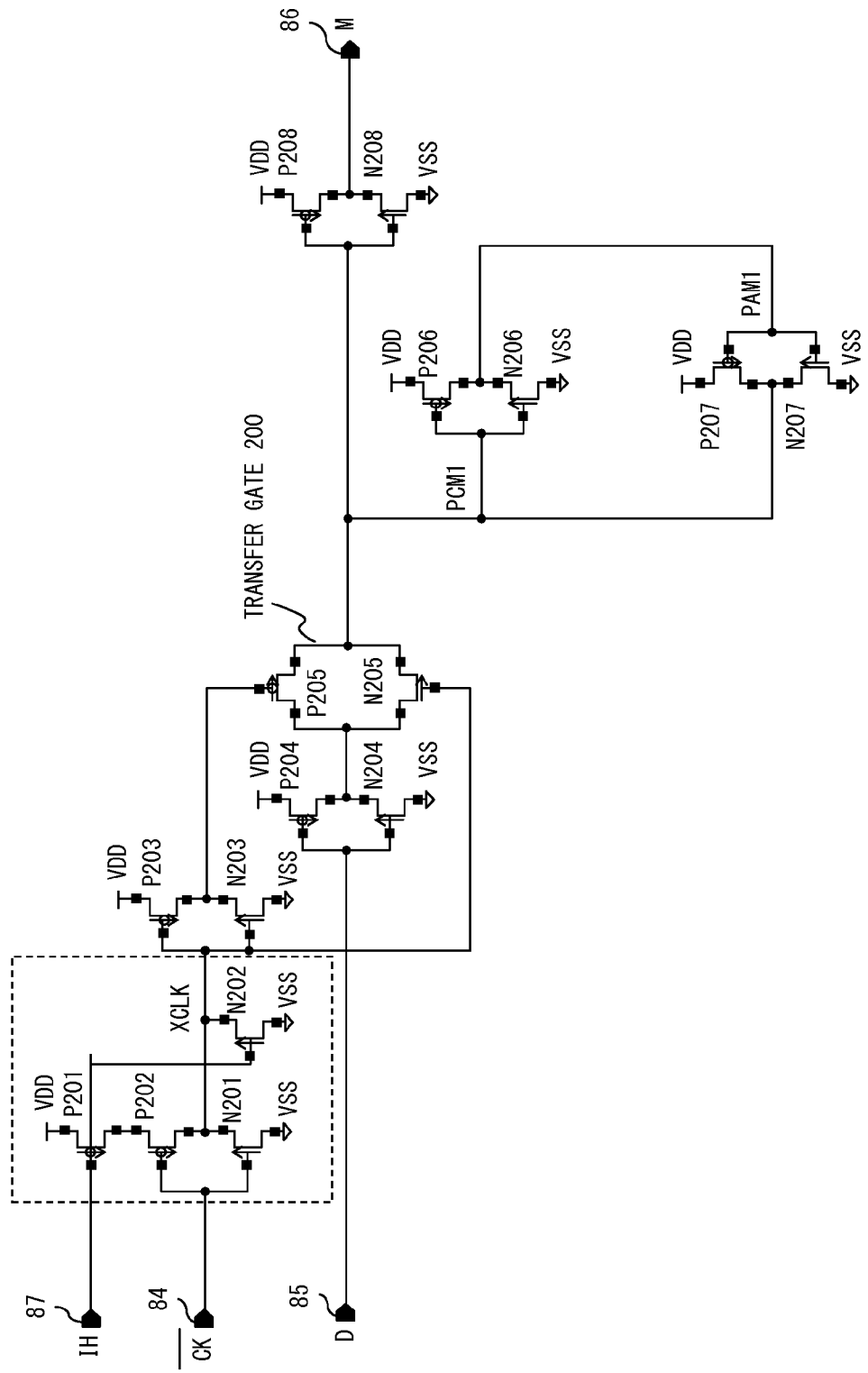
FIG. 9 is an example of the circuit of a clock internal propagation suppressing unit 82 and a latch unit 83 in FIG. 8.

FIG. 9 is an example of the configuration of the circuit of the clock internal propagation suppressing unit 82 and the latch unit 83.

The circuit includes PMOS transistors P201, P202, P203, P204, P205, P206, P207, and P208, and NMOS transistors N201, N202, N203, N204, N205, N206, N207, and N208.

The source terminal of the PMOS transistor P201 is connected to the high-voltage side power supply terminal, the gate terminal is connected to an IH pin 87. The source terminal of the PMOS transistor P202 is connected to the drain terminal of the PMOS transistor P201, and the gate terminal is connected to a clock input terminal 84. The source terminal of the NMOS transistor N201 is connected to the low-voltage side power supply terminal, the gate terminal is connected to the clock input terminal 84, and the drain terminal is connected to the drain terminal of the PMOS transistor P202. The source terminal of the NMOS transistor N202 is connected to the low-voltage side power supply terminal, the gate terminal is connected to the IH pin 87, and the drain terminal is connected to the drain terminals of the PMOS transistor P202 and the NMOS transistor N201.

The portion (enclosed by the dotted lines in FIG. 9) configured by the PMOS transistors P201 and P202 and the NMOS transistors N201 and N202 corresponds to the clock internal propagation suppressing unit 82 in FIG. 8. That is, the portion controls the internal propagation of the clock signal. When the IH signal as a control signal for suppression of the internal propagation of a clock signal indicates H, the PMOS transistor P201 is placed in the OFF state, the NMOS transistor N202 is placed in the ON state, and the internal clock signal XCLK constantly indicates L. That is, when the IH signal indicates H, the propagation of the clock signal from the clock input terminal 84 is suppressed. On the other hand, if the IH signal indicates L, and the inverted clock input from the clock input terminal 84 indicates L, then the PMOS transistors P201 and P202 are placed in the ON state, the NMOS transistors N201 and N202 are placed in the OFF state, and the internal clock signal XCLK indicates H. If the IH signal indicates H, and the inverted clock input from the clock input terminal 84 indicates H, then the PMOS transistors P201 and P202 are placed in the OFF state, the NMOS transistors N201 and N202 are placed in the ON state, and the internal clock signal XCLK indicates L. Thus, when the IH signal indicates L, the inverted result (signal) of the inverted clock input from the clock input terminal 84 propagates as the internal clock signal XCLK to the latch unit 83.

The portion corresponding to the latch unit 83 in FIG. 8 is described below.

The source terminal of the PMOS transistor P203 is connected to the high-voltage side power supply terminal, the internal clock signal XCLK is input to the gate terminal. The source terminal of the NMOS transistor N203 is connected to the low-voltage side power supply terminal, the internal clock signal XCLK is input to the gate terminal, and the drain terminal is connected to the drain terminal of the PMOS transistor P203. The PMOS transistor P203 and the NMOS transistor N203 configure an inverter.

The source terminal of the p204 is connected to the high-voltage side power supply terminal, and the gate is connected to a data input terminal 85. The source terminal of the NMOS transistor N204 is connected to the low-voltage side power supply terminal, the gate terminal is connected to the data input terminal 85, and the drain terminal is connected to the drain terminal of the PMOS transistor P204. The PMOS transistor P204 and the NMOS transistor N204 configure an inverter.

The source terminal of the PMOS transistor P205 is connected to the drain terminals of the PMOS transistor P204 and the NMOS transistor N204, the gate terminal is connected to the drain terminals of the PMOS transistor P203 and the NMOS transistor N203. The source terminal of the NMOS transistor N205 is connected to the drain terminals of the PMOS transistor P204 and the NMOS transistor N204, and the internal clock signal XCLK is input to the gate terminal. The PMOS transistor P205 and the NMOS transistor N205 which are pass transistors configure a transfer gate 200. The signal obtained by inverting the input data signal input from the data input terminal 85 when the gate terminal of the PMOS transistor P205 indicates L and the gate terminal of the NMOS transistor N205 indicates H is output as the data signal PCM1.

The source terminal of the PMOS transistor P206 is connected to the high-voltage side power supply terminal, and the data signal PCM1 is input to the gate terminal. The source terminal of the NMOS transistor N206 is connected to the low-voltage side power supply terminal, the data signal PCM1 is input to the gate terminal, and the drain terminal is connected to the drain terminal of the PMOS transistor P206. The PMOS transistor P206 and the NMOS transistor N206 configure an inverter, invert the data signal PCM1, and output the data signal PAM1.

The source terminal of the PMOS transistor P207 is connected to the high-voltage side power supply terminal, and the data signal PAM1 is input to the gate terminal. The source terminal of the NMOS transistor N207 is connected to the low-voltage side power supply terminal, the data signal PAM1 is input to the gate terminal, and the drain terminal is connected to the drain terminal of the PMOS transistor P207. The PMOS transistor P207 and the NMOS transistor N207 configure an inverter, invert the data signal PAM1, and output the data signal PCM1.

The loop portion by two inverter circuits configured by the PMOS transistors P206 and P207 and the NMOS transistors N206 and N207 has the function of holding latch data.

The source terminal of the PMOS transistor P208 is connected to the high-voltage side power supply terminal, and the data signal PCM1 is input to the gate terminal. The source terminal of the NMOS transistor N208 is connected to the low-voltage side power supply terminal, the data signal PCM1 is input to the gate terminal, and the drain terminal is connected to the drain terminal of the PMOS transistor P208. The PMOS transistor P208 and the NMOS transistor N208 configure an inverter, invert the data signal PCM1, and output the resultant signal to the data output terminal 86.

The portion configured by the PMOS transistors P203, P204, P205, P206, P207, and P208 and the NMOS transistor N203, N204, N205, N206, and N207 corresponds to the latch unit 83 in FIG. 8.

Back in FIG. 8, the input data is input from the data input terminal 85 to the data matching detection unit 81, the output data signal is input from the data output terminal 86, and the IH signal for control of the clock propagation in the latch circuit is output to the clock internal propagation suppressing unit 82. The IH signal and the signal from the clock input terminal 84 are input to the clock internal propagation suppressing unit 82, and the clock internal propagation suppressing unit 82 outputs the internal clock signal XCLK to the latch unit 83.

The data matching detection unit 81 compares the input data signal with the output data signal, and outputs an IH signal at H when the data signals match at L or H.

Thus, the embodiment 1 replaces the ENOR circuit which conventionally compares the input/output data of the latch unit as illustrated in FIG. 4 with the data matching detection unit 81.

Figure 10:
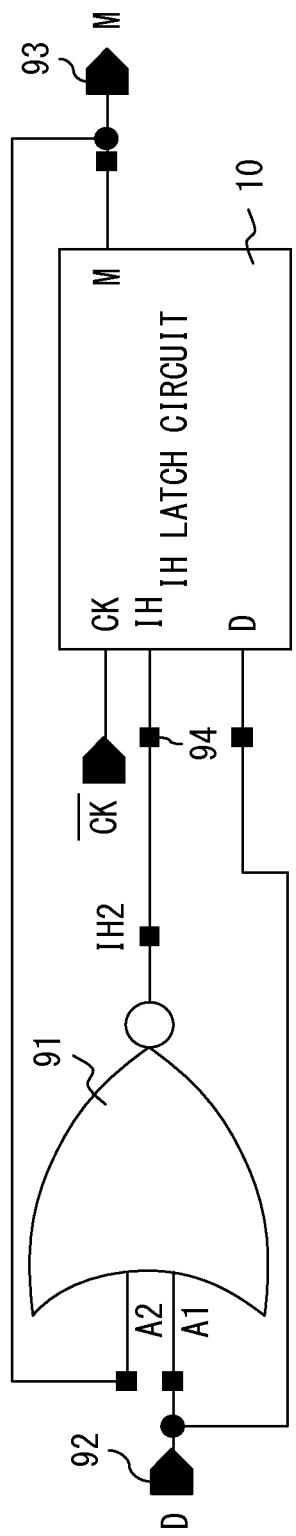
FIG. 10 is a circuit example 1.
Figure 13:
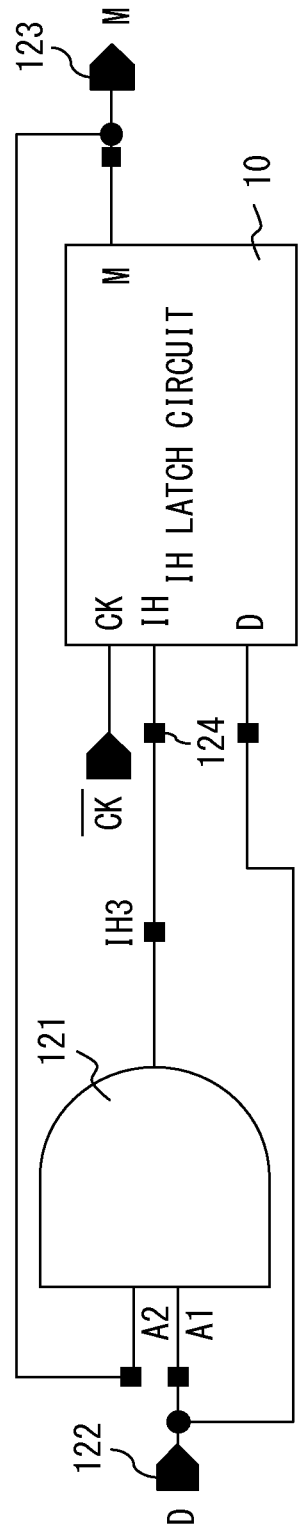
FIG. 13 is a circuit example 2.

FIG. 10 (circuit example 1) and FIG. 13 (circuit example 2) illustrate the circuit example of the embodiment 1.

Circuit Example 1

First, the circuit example 1 is described below.

As illustrated in FIG. 10, in the circuit example 1, the input data signal D input to a data input terminal 92 of the IH latch circuit 10 (which is the same as illustrated in FIG. 1) and the output data signal M output to a data output terminal 93 are input to a NOR (negative logical sum) circuit 91 for comparison. A result of the data comparison (that is, IH2) is output to an IH pin 94. The NOR circuit 91 outputs H as the IH2 signal when the two input signals match at L. That is, only when the latched data indicates L (that is, 0) and the input data indicates L (that is, 0), the internal clock XCLK in the IH latch circuit 10 stops.

FIG. 11 is a timing chart of the circuit example 1. When the input data signal D and the output data signal M indicate L (in the case of timing 1), the IH2 as an output signal from the NOR circuit 91 indicates H. Thus, the internal clock signal XCLK in the IH latch circuit 10 indicates L. In the circuit example 1, when the input/output data signals match at L (that is, 0), the internal propagation of the clock signal can be suppressed.

Figure 12:
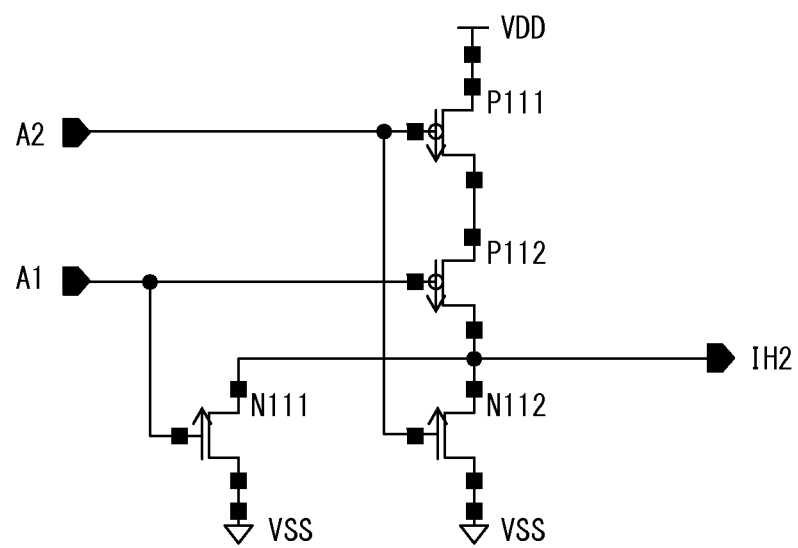
FIG. 12 is an example of the detailed configuration of a NOR circuit.

FIG. 12 is an example of the detailed configuration of the NOR circuit 91. As illustrated in FIG. 12, the NOR circuit can be configured by four transistors. Six transistors can be saved as compared with the case in which the input/output data comparison circuit of the latch circuit is configured by ENOR circuits. The input data signal input from the input terminal A1 only have to drive two transistors of a PMOS transistor P112 and an NMOS transistor N111, and the input data signal input from the input terminal A2 only have to drive two transistors of a PMOS transistor P111 and an NMOS transistor N112. That is, the input capacitance is lower than the input capacitance (fan-in capacitance) of the ENOR circuit.

Circuit Example 2

The circuit example 2 is described next with reference to FIG. 13.

In the circuit example 2, the input data signal D input to a data input terminal 122 of the IH latch circuit 10 (which is the same as illustrated in FIG. 1) and the output data signal M output to the data output terminal 123 are input to an AND (logical product) circuit 121 for comparison. A result of the data comparison (that is, IH3) is output to an IH pin 124. The AND circuit 121 outputs H when the two input signals match at L. That is, only when the latched data indicates H (that is, 1) and the input data indicates H (that is, 1), the internal clock XCLK stops.

FIG. 14 is a timing chart of the circuit example 2. When the input data signal D and the output data signal M indicate H (in the case of timing 3), the IH3 as an output signal from the AND circuit 121 indicates H. Thus, the internal clock signal XCLK in the IH latch circuit 10 indicates L. In the circuit example 2, when the input/output data signals match at H (that is, 1), the internal propagation of the clock signal can be suppressed.

FIG. 15 is an example of the detailed configuration of the AND circuit 112. As illustrated in FIG. 15, the AND circuit can be configured by six transistors. Four transistors can be saved as compared with the case in which the input/output data comparison circuit of the latch circuit is configured by ENOR circuits. The input data signal input from the input terminal A1 only have to drive two transistors of a PMOS transistor P142 and an NMOS transistor N141, and the input data signal input from the input terminal A2 only have to drive two transistors of a PMOS transistor P141 and an NMOS transistor N142. That is, the input capacitance is lower than the input capacitance (fan-in capacitance) of the ENOR circuit.

Thus, the embodiment 1 is described above with reference to the circuit examples 1 and 2.

In the embodiment 1, the function of detecting the matching of input/output data, which has been conventionally configured by an ENOR circuit, is configured using the NOR circuit or the AND circuit. That is, it has conventionally been detected in both cases in which the input/output data match at L (0) and H (1). However, in the present embodiment, it is detected in one case in which the data match at H (1) or L (0). Thus, in the present embodiment, the data matching at L (0) or H (1) can be detected. However, by configuring the data matching detection unit 81 using the NOR circuit or the AND circuit, the number of transistors required for the circuit of the portion for control of the internal clock propagation of the latch circuit can be smaller than in the conventional circuit. That is, in the case of the NOR circuit, the propagation of the internal clock can be suppressed only when the input data and the output data match at L, and in the case of the AND circuit, the propagation of the internal clock can be suppressed only when the input data and the output data match at H. By replacing the ENOR circuit with the NOR circuit or the AND circuit, the number of transistors configuring the circuit can be reduced. Whether the NOR circuit is used or the AND circuit is used can be determined by considering whether it is probable that the latch value is L (0) or H (1), thereby effectively reducing the power consumption. The study of the power consumption is described later with reference to FIGS. 21, 22, and 23.

The embodiment 2 is described below.

Embodiment 2

The embodiment 2 realizes the effect equivalent to the circuit according to the embodiment 1 by using the smaller number of transistors. FIG. 16 is a block diagram of the latch circuit and the clock control circuit according to the embodiment 2.

The latch circuit according to the embodiment 2 includes a data matching detection and clock internal propagation suppression unit 151 and a latch unit 152. The clock control circuit includes the clock internal propagation suppression unit 151.

An input data signal from a data input terminal 154 is input to the data matching detection and clock internal propagation suppression unit 151, an output data signal from a data output terminal 155 is input, and a clock signal from a clock input terminal 153 is input. The data matching detection and clock internal propagation suppression unit 151 compares the input data signal with the output data signal, and stops the internal clock signal XCLK only when both data signals match at L or at H. Thus, the data matching detection and clock internal propagation suppression unit 151 outputs the internal clock signal XCLK to the latch unit 152. The latch unit 152 holds and outputs an input value, and corresponds to the latch unit 83 in FIG. 8. Therefore, the detailed descriptions of the latch unit 152 are omitted here.

Described below is a circuit example of the embodiment 2.

Circuit Example 3

Figure 17:
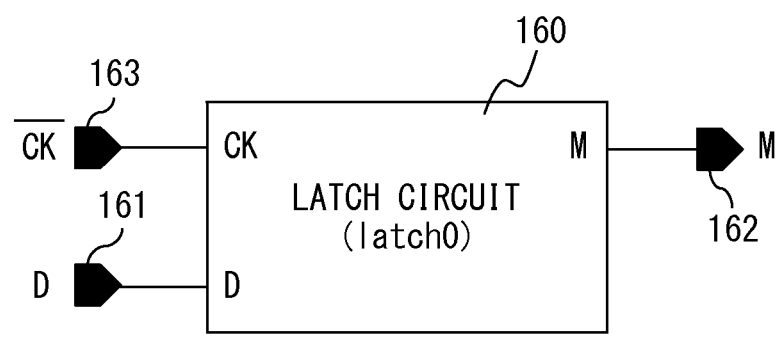
FIG. 17 is a circuit example 3.

A latch circuit 160 of the circuit example 3 in FIG. 17 realizes the effect equivalent to the latch circuit using the NOR circuit illustrated in FIG. 10. It is hereafter referred to as a latch 0 circuit.

The latch circuit 160 of the circuit example 3 includes a data input terminal 161 to which the input data signal D is input, a data output terminal 162 from which the output data signal M is output, and a clock input terminal 163 to which a inverted clock signal is input.

Figure 18:
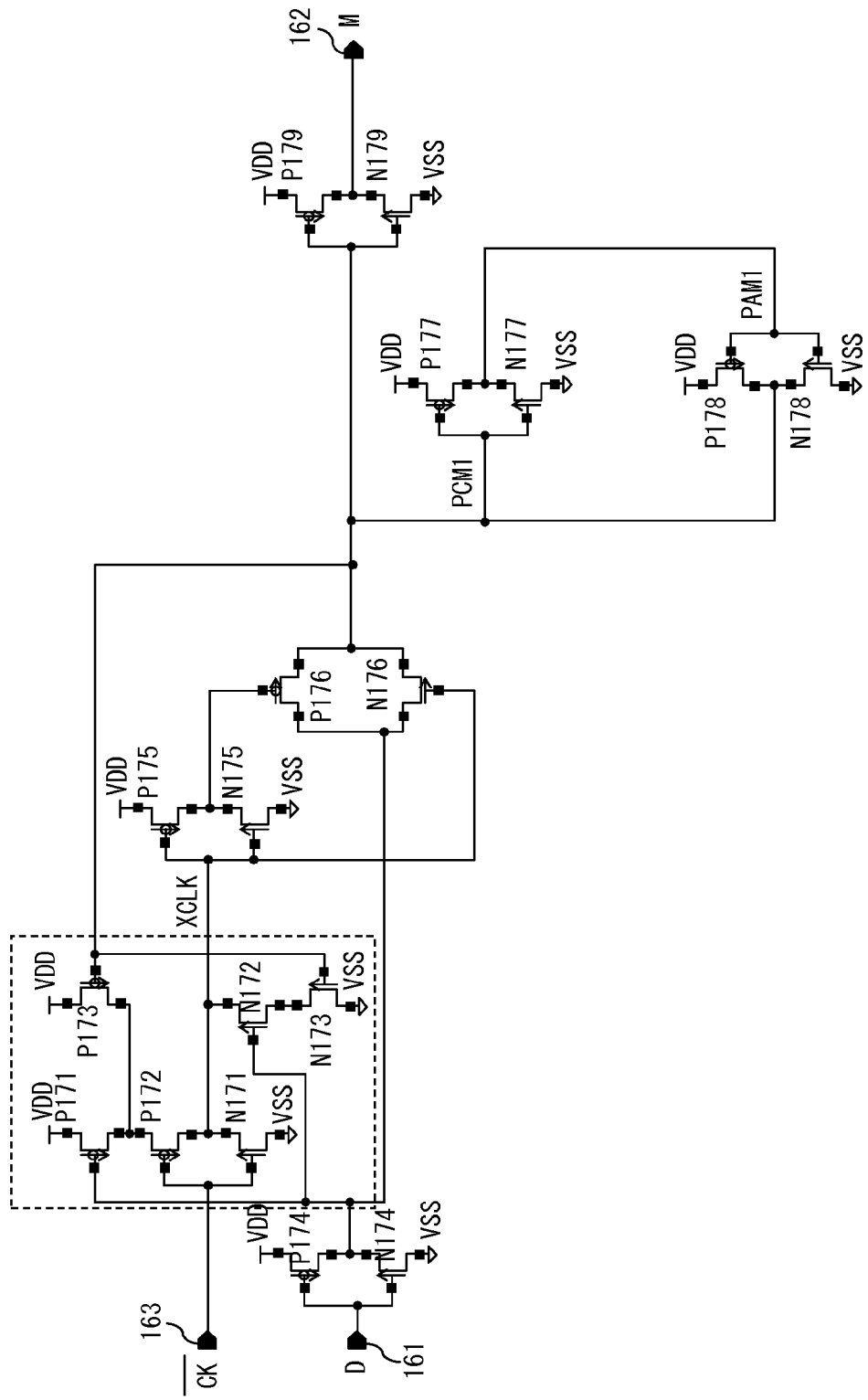
FIG. 18 is an example of the detailed configuration of the circuit example 3.

FIG. 18 illustrates an example of a detailed circuit of the latch circuit 160.

The circuit includes PMOS transistors P171, P172, P173, P174, P175, P176, P177, P178, and P179, and NMOS transistors N171, N172, N173, N174, N175, N176, N177, N178, and N179.

In FIG. 18, the wiring from the PCM1 to the PMOS transistor P173 and the NMOS transistor N173 can be started from the inverter provided after M which corresponds to the same logic as the data signal PCM1.

The portion other than the enclosure by the dotted lines in FIG. 18 corresponds to the latch unit 152, and corresponds to the portion configured by the PMOS transistors P3, P4, P5, P6, P7, and P8, and NMOS transistors N3, N4, N5, N6, and N7. It is described in detail below.

The source terminal of the PMOS transistor P175 is connected to the high-voltage side power supply terminal, and the internal clock signal XCLK is input to the gate terminal. The source terminal of the NMOS transistor N175 is connected to the low-voltage side power supply terminal, the internal clock signal XCLK is input to the gate terminal, and the drain terminal is connected to the drain terminal of the PMOS transistor P175. The PMOS transistor P175 and the NMOS transistor N175 configure an inverter.

The source terminal of the PMOS transistor P174 is connected to the high-voltage side power supply terminal, and the gate terminal is connected to the data input terminal 161. The source terminal of the NMOS transistor N174 is connected to the low-voltage side power supply terminal, and the gate terminal is connected to the data input terminal 161. The PMOS transistor P174 and the NMOS transistor N174 configure an inverter.

The source terminal of the PMOS transistor P176 is connected to the drain terminals of the PMOS transistor P174 and the NMOS transistor N174, and the gate terminal is connected to the drain terminals of the PMOS transistor P175 and the NMOS transistor N175. The source terminal of the NMOS transistor N176 is connected to the drain terminals of the PMOS transistor P174 and the NMOS transistor N174, and the internal clock signal XCLK is input to the gate terminal. The PMOS transistor P176 and the NMOS transistor N176 configure a transfer gate terminal, and output as the data signal PCM1 the signal obtained by inverting the input data signal input from the data input terminal 161 when the gate terminal of the PMOS transistor P176 indicates L and the gate terminal of the NMOS transistor N176 indicates H.

The source terminal of the PMOS transistor P177 is connected to the high-voltage side power supply terminal, and the data signal PCM1 is input to the gate terminal. The source terminal of the NMOS transistor N177 is connected to the low-voltage side power supply terminal, the data signal PCM1 is input to the gate terminal, and the drain terminal is connected to the drain terminal of the PMOS transistor P177. The PMOS transistor P177 and the NMOS transistor N177 configure an inverter, invert the data signal PCM1, and output the data signal PAM1.

The source terminal of the PMOS transistor P178 is connected to the high-voltage side power supply terminal, and the data signal PAM1 is input to the gate terminal. The source terminal of the NMOS transistor N178 is connected to the low-voltage side power supply terminal, the data signal PAM1 is input to the gate terminal, and the drain terminal is connected to the drain terminal of the PMOS transistor P178. The PMOS transistor P178 and the NMOS transistor N178 configure an inverter, invert the data signal PAM1, and output the data signal PCM1.

The portion configured by the PMOS transistors P177 and P178 and the NMOS transistors N177 and N178 has the function of holding latch data.

The source terminal of the PMOS transistor P179 is connected to the high-voltage side power supply terminal, and the data signal PCM1 is input to the gate terminal. The source terminal of the NMOS transistor N179 is connected to the low-voltage side power supply terminal, the data signal PCM1 is input to the gate terminal, and the drain terminal is connected to the drain terminal of the PMOS transistor P179. The PMOS transistor P179 and the NMOS transistor N179 configure an inverter, invert the data signal PCM1, and output the obtained signal to the data output terminal 162.

Figure 3:
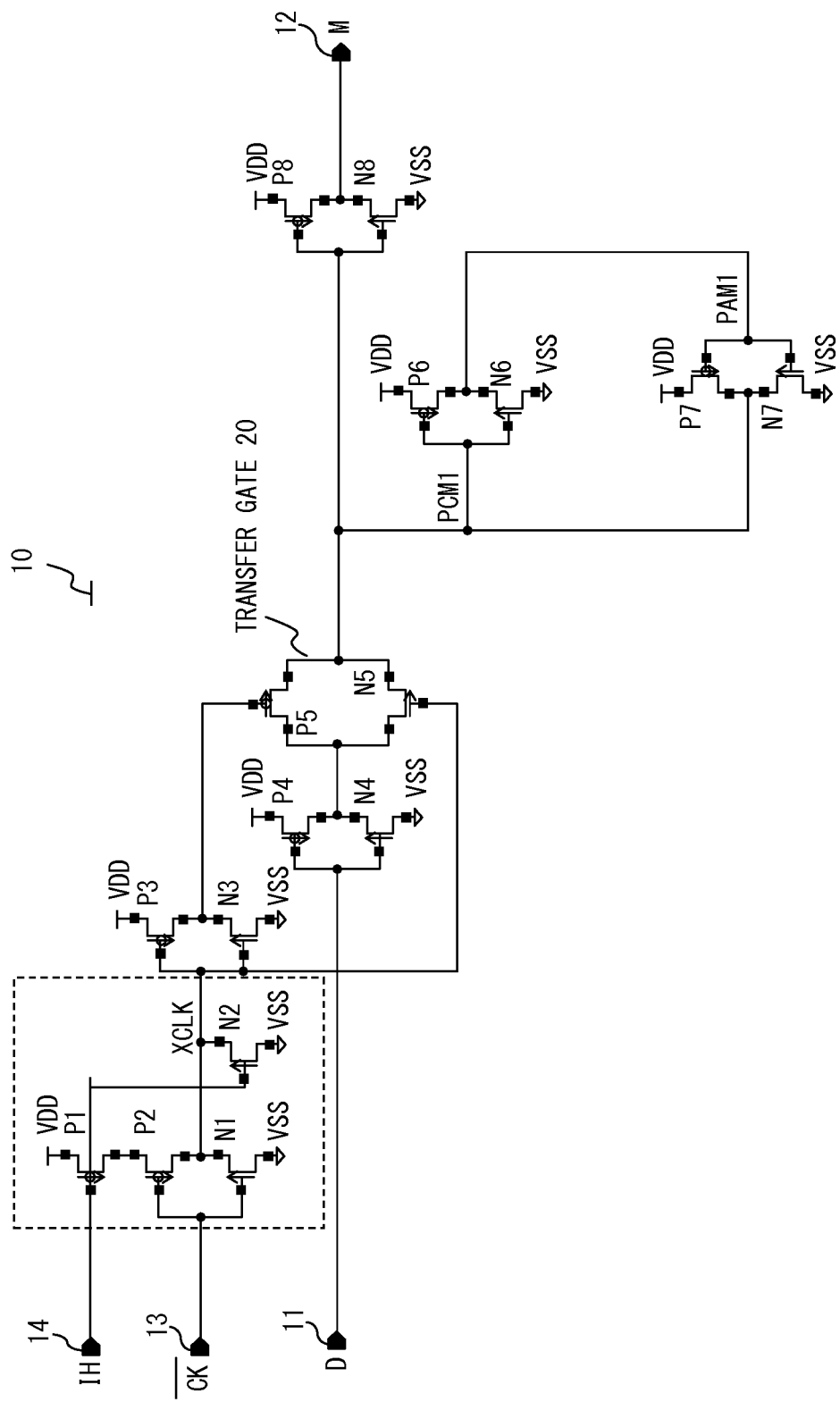
FIG. 3 illustrates an example of the configuration of the IH latch circuit.
Figure 6:
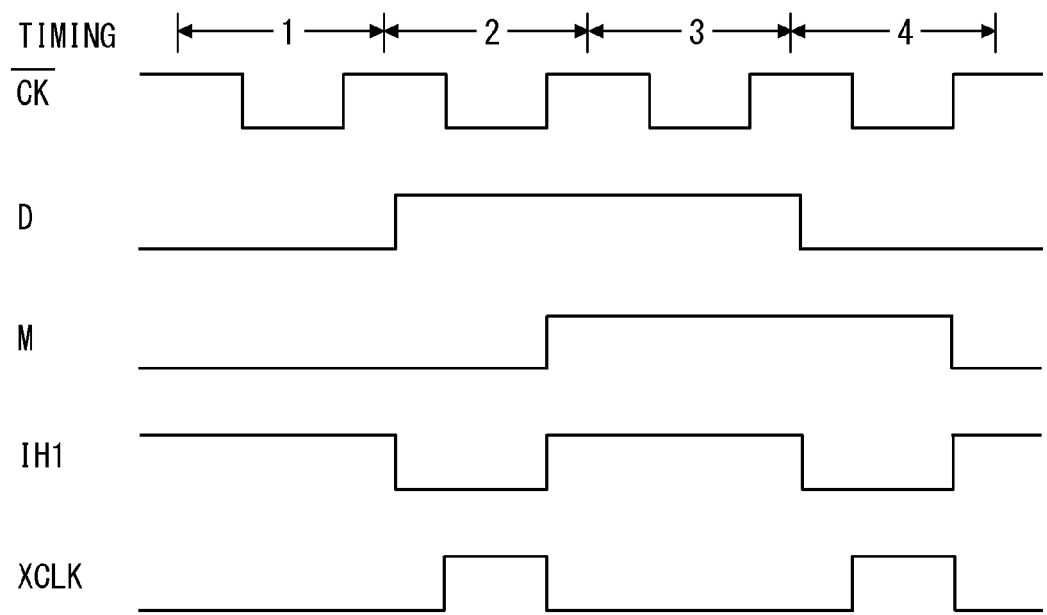
FIG. 6 is a timing chart of the IH latch circuit when the output from the ENOR circuit is input to the IH pin
Figure 7:
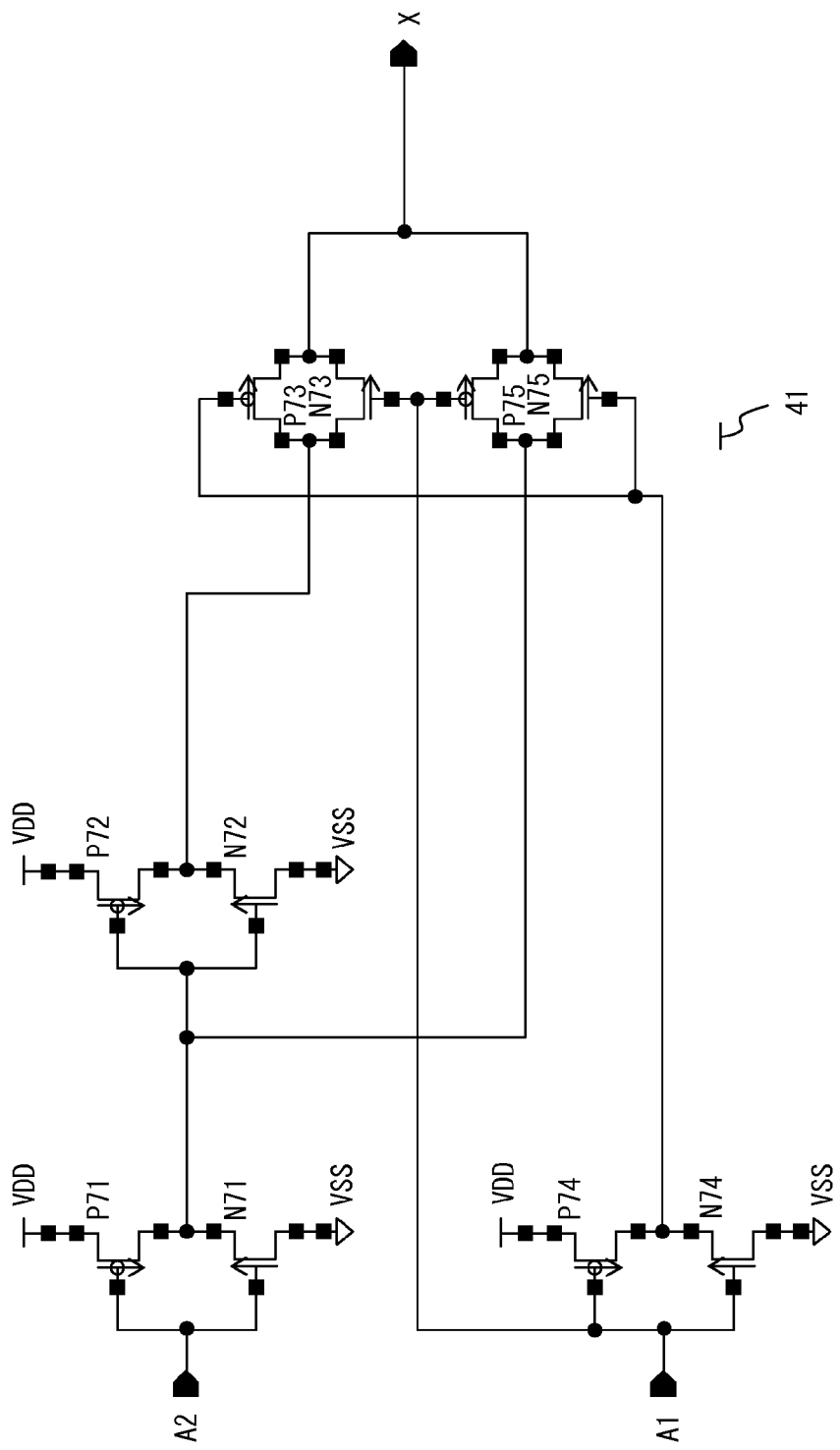
FIG. 7 is an example of the configuration of the ENOR circuit.

Thus, the portion configured by the PMOS transistors P174, P175, P176, P177, P178, and P179, and the NMOS transistors N174, N175, N176, N177, N178, and N179 corresponds to the latch unit explained with reference to FIG. 3.

The portion other than the enclosure by the dotted lines in FIG. 18, that is, the configuration of the latch unit can be otherwise configured.

The portion enclosed by the dotted lines in FIG. 18 corresponds to the data matching detection and clock internal propagation suppression unit 151, and operates as follows.

When the input data signal D indicates L and the output data signal M indicates L, the data signal PCM1 indicates H, and the circuit operates as follows. By the inverter formed by the PMOS transistor P174 and the NMOS transistor N174, the input data signal D is inverted. Thus, the NMOS transistor N172 is placed in the ON state. Since the data signal PCM1 indicates H, the NMOS transistor N172 is placed in the ON state. Thus, the internal clock signal XCLK indicates L regardless of state of L or H of the signal input from the clock input terminal 163, and the clock propagation is suppressed.

When the input data signal D indicates H and the output data signal M indicates H, the data signal PCM1 indicates L, the PMOS transistors P171 and P173 are placed in the ON state, and the NMOS transistors N172 and N173 are placed in the OFF state. Thus, the inverted clock $\overline{CK}$ input from the clock input terminal 163 is inverted by the inverter configured by the PMOS transistor P172 and the NMOS transistor N171, and output as the internal clock signal XCLK.

When the input data signal D indicates H and the output data signal M indicates L, the data signal PCM1 indicates H, the PMOS transistors P171 is placed in the ON state, the PMOS transistor P173 is placed in the OFF state, the NMOS transistors N172 is placed in the OFF state, and the NMOS transistor N173 is placed in the ON state. Thus, the inverted clock $\overline{CK}$ input from the clock input terminal 163 is inverted by the inverter configured by the PMOS transistor P172 and the NMOS transistor N171, and is output as the internal clock signal XCLK.

When the input data signal D indicates L and the output data signal M indicates H, the data signal PCM1 indicates L, the PMOS transistor P171 is placed in the OFF state, the PMOS transistor P173 is placed in the ON state, the NMOS transistor N172 is placed in the ON state, and the NMOS transistor N173 is placed in the OFF state. Thus, the inverted clock input from the clock input terminal 163 is inverted by the inverter configured by the PMOS transistor P172 and the NMOS transistor N171, and is output as the internal clock signal XCLK.

As described above, like the latch circuit using the NOR circuit, it is obvious that the latch circuit 160 of the circuit example 3 has a similar effect of suppressing the propagation of the internal clock signal XCLK in the latch unit when the input data signal D and the output data signal M match at L. That is, the timing chart of the circuit example 3 is similar to D, M, and XCLK in FIG. 11.

In addition, the number of transistors of the circuit example 3 is compared with the number of transistors of the circuit example 1 (FIG. 10) as follows. The number of the transistors in the circuit example 1 is a total of 20, that is, four in the NOR circuit 91 (FIG. 12), and 16 in the IH latch circuit 10 (FIG. 3). The number of transistors in the circuit example 3 is 18 as illustrated in FIG. 18. Thus, the number of transistors in the circuit example 3 is smaller by two than the number of transistors in the circuit example 1.

Circuit Example 4

Described next is a circuit example according to the embodiment 2.

A latch circuit 180 in the circuit example 4 realizes the effect equivalent to the latch circuit using an AND circuit illustrated in FIG. 13. It is hereafter referred to as a latch 1 circuit.

The latch circuit 180 of the circuit example 4 includes a data input terminal 181 for inputting the input data signal D, a data output terminal 182 from which the output data signal M is output, and a clock input terminal 183 to which the inverted clock signal is input.

Figure 20:
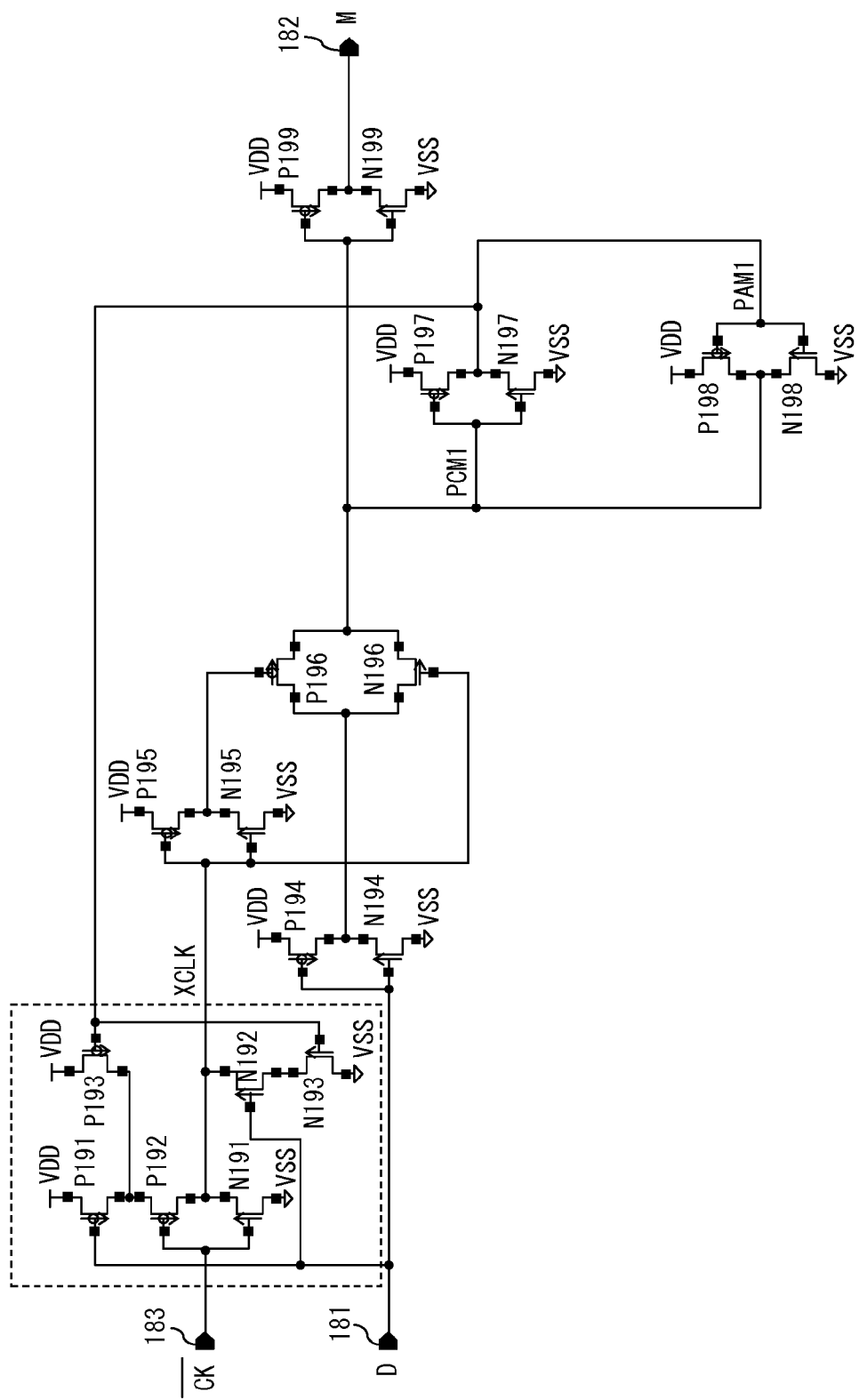
FIG. 20 is an example of the detailed configuration of the circuit example 4.

FIG. 20 illustrates an example of the detailed circuit.

The circuit includes PMOS transistors P191, P192, P193, P194, P195, P196, P197, P198, and P199, and NMOS transistors N191, N192, N193, N194, N195, N196, N197, N198, and N199.

In FIG. 20, the wiring from the data signal PAM1 to the PMOS transistor P193 and the NMOS transistor N193 can be arranged from M indicating an equivalent logic of the data signal PAM1.

The portion other than the enclosure by the dotted lines in FIG. 20 corresponds to the latch unit 152, and corresponds to the portion configured by the PMOS transistors P3, P4, P5, P6, P7, and P8, and the NMOS transistors N3, N4, N5, N6, and N7. The details are described as follows.

The source terminal of the PMOS transistor P195 is connected to the high-voltage side power supply terminal, and the internal clock signal XCLK is input to the gate terminal. The source terminal of the NMOS transistor N195 is connected to the low-voltage side power supply terminal, the internal clock signal XCLK is input to the gate terminal, and the drain terminal is connected to the drain terminal of the PMOS transistor P195. The PMOS transistor P195 and the NMOS transistor N195 configure an inverter.

The source terminal of the PMOS transistor P194 is connected to the high-voltage side power supply terminal, and the gate terminal is connected to the data input terminal 161. The source terminal of the NMOS transistor N194 is connected to the low-voltage side power supply terminal, and the gate terminal is connected to the data input terminal 181. The PMOS transistor P194 and the NMOS transistor N194 configure an inverter.

The source terminal of the PMOS transistor P196 is connected to the drain terminals of the PMOS transistor P194 and the NMOS transistor N194, and the gate terminal is connected to the drain terminals of the PMOS transistor P195 and the NMOS transistor N195. The source terminal of the NMOS transistor N196 is connected to the drain terminals of the PMOS transistor P194 and the NMOS transistor N194, and the internal clock signal XCLK is input to the gate terminal. The PMOS transistor P196 and the NMOS transistor N196 configure a transfer gate terminal, and the signal obtained by inverting the input data signal input from the data input terminal 181 when the gate terminal of the PMOS transistor P196 indicates L and the gate terminal of the NMOS transistor N196 indicates H is output as the data signal PCM1.

The source terminal of the PMOS transistor P197 is connected to the high-voltage side power supply terminal, and the data signal PCM1 is input to the gate terminal. The source terminal of the NMOS transistor N197 is connected to the low-voltage side power supply terminal, the data signal PCM1 is input to the gate terminal, and the drain terminal is connected to the drain terminal of the PMOS transistor P197. The PMOS transistor P197 and the NMOS transistor N197 configure an inverter, invert the data signal PCM1, and output the data signal PAM1.

The source terminal of the PMOS transistor P198 is connected to the high-voltage side power supply terminal, and the data signal PAM1 is input to the gate terminal. The source terminal of the NMOS transistor N198 is connected to the low-voltage side power supply terminal, the data signal PAM1 is input to the gate terminal, and the drain terminal is connected to the drain terminal of the PMOS transistor P198. The PMOS transistor P198 and the NMOS transistor N198 configure an inverter, inverts the data signal PAM1, and outputs the data signal PCM1.

The portion configured by the PMOS transistors P197 and P198, and the NMOS transistors N197 and N198 has the function of holding latch data.

The source terminal of the PMOS transistor P199 is connected to the high-voltage side power supply terminal, and the data signal PCM1 is input to the gate terminal. The source terminal of the NMOS transistor N199 is connected to the low-voltage side power supply terminal, the data signal PCM1 is input to the gate terminal, and the drain terminal is connected to the drain terminal of the PMOS transistor P199.

The PMOS transistor P199 and the NMOS transistor N199 configure an inverter, invert the data signal PCM1, and output the resultant signal to the data output terminal 162.

Thus, the portion configured by the PMOS transistors P194, P195, P196, P197, P198, and P199, and the NMOS transistors N194, N195, N196, N197, N198, and N199 corresponds to the latch unit explained with reference to FIG. 3.

The configuration of the portion other than the enclosure by the dotted lines in FIG. 20, that is, the latch unit, can be another configuration.

The portion enclosed by the dotted lines in FIG. 20 corresponds to the data matching detection and clock internal propagation suppression unit 151, and operates as follows.

When the input data signal D indicates H, and the output data signal M indicates H, the data signal PAM1 indicates H, the PMOS transistors P191 and P193 are placed in the OFF state, the NMOS transistors N192 and N193 are placed in the ON state. Thus, whether the signal input from the clock input terminal 183 indicates L or H, the internal clock signal XCLK signal indicates L, thereby suppressing the clock propagation.

When the input data signal D indicates L and the output data signal M indicates L, the data signal PAM1 indicates L, the PMOS transistors P191 and P193 are placed in the ON state, and the NMOS transistors N192 and N193 are placed in the OFF state. Thus, the inverted clock $\overline{CK}$ input from the clock input terminal 183 is inverted by the inverter configured by the PMOS transistor P192 and the NMOS transistor N191, and is output as the internal clock signal XCLK.

When the input data signal D indicates H and the output data signal M indicates L, the data signal PAM1 indicates L, the PMOS transistors P191 is placed in the OFF state, the PMOS transistor P193 is placed in the ON state, the NMOS transistors N192 is placed in the OFF state, and the NMOS transistor N193 is placed in the ON state. Thus, the inverted clock $\overline{CK}$ input from the clock input terminal 163 is inverted by the inverter configured by the PMOS transistor P172 and the NMOS transistor N171, and is output as the internal clock signal XCLK.

When the input data signal D indicates L and the output data signal M indicates H, the data signal PAM1 indicates H, the PMOS transistor P191 is placed in the ON state, the PMOS transistor P193 is placed in the OFF state, the NMOS transistor N192 is placed in the OFF state, and the NMOS transistor N193 is placed in the ON state. Thus, the inverted clock input from the clock input terminal 163 is inverted by the inverter configured by the PMOS transistor P192 and the NMOS transistor N191, and is output as the internal clock signal XCL.

As described above, it is obvious that the latch circuit 180 of the circuit example 4 has a similar effect of suppressing the propagation of the internal clock signal XCLK in the latch unit when the input data signal D and the output data signal M match at H. That is, the timing chart of the circuit example 4 is similar to D, M, and XCLK in FIG. 14.

The number of transistors of the circuit example 4 is compared with the number of transistors of the circuit example 2 (FIG. 13) as follows. The number of the transistors in the circuit example 2 is a total of 22, that is, six in the AND circuit (FIG. 15), and 16 in the IH latch circuit 10 (FIG. 3). The number of transistors in the circuit example 4 is 18 as illustrated in FIG. 20. Thus, the number of transistors in the circuit example 4 is smaller by four than the number of transistors in the circuit example 2.

As described above, the embodiment 2 can further reduce the number of transistors required to configure a latch circuit as compared with the embodiment 1. In the embodiment 2, as in the embodiment 1, the propagation of the internal clock can be suppressed only when the input/output data of the latch circuit match at L (0) in the circuit example 3. In the circuit example 4, the propagation of the internal clock can be suppressed only when the input/output data of the latch circuit match at H (1). Therefore, the power consumption can be effectively reduced by using the circuit example 3 or 4 by considering whether or not it is probable that the latch value is L (0) or H (1). The study of the power consumption is described later with reference to FIGS. 21, 22, and 23.

The embodiments of the present invention are described above in detail with reference to the circuit examples 1 through 4. As described above, the disclosed latch circuit can reduce the number of transistors as compared with the conventional circuit.

Relating to the disclosed circuit example, the power consumption of each circuit is actually measured to verify that the power consumption is reduced. The measurement result is illustrated in FIGS. 21, 22, and 23.

FIG. 21 illustrates a result of measuring the average power on the circuit examples 1 through 4, the circuit illustrated in FIG. 1 (the IH terminal clipped at L), and the circuit illustrated in FIG. 4 (using an ENOR circuit) in each operation pattern, and setting the resultant data based on the circuit in FIG. 4. Each operation pattern of (1) through (4) refers to the pattern corresponding to the timing 1 through 4 illustrated in FIGS. 5, 6, 11, 14, and etc.

In FIG. 21, "(1) 0→0" refers to the average power of the circuit when the data of the data output terminal does not change as 0, "(2) 0→1" refers to the average power of the circuit when the data of the data output terminal changes from 0 to 1, "(3) 1→1" refers to the average power of the circuit when the data of the data output terminal does not change as 1, and "(4) 1→0" refers to the average power of the circuit when the data of the data output terminal changes from 1 to 0.

FIG. 22 illustrates the result of obtaining the average power etc. from the measurement result in FIG. 21. In FIG. 22, the "average (=operation rate of 50%)" refers to the average obtained as the case (operation rate or 50%) in which each of (1) through (4) accounts for 25%. Furthermore, "0→0 97%" in FIG. 22 is obtained as power consumption of (0→0)×0.97+ power consumption of (0→1)×0.01+ power consumption of (1→1)×0.01+ power consumption of (1→0)×0.01. "1→1 97%" in FIG. 22 is obtained as power consumption of (0→0)×0.01+ power consumption of (0→1)×0.01+ power consumption of (1→1)×0.97+ power consumption of (1→0)×0.01. That is, the former refers to the power consumption when the pattern of 0→0 is 97%, and the latter refers to the power consumption when the pattern of 1→1 is 97%.

Referring to FIG. 21, in the circuit example 1, each power consumption becomes 70.1%, 67.3%, and 71.5% in the case of 0→0, 0→1, and 1→0 as compared with the case in which the ENOR circuit in FIG. 4 is used, which is lower than the case in which the ENOR circuit is used (100%). However, in the case of 1→1, it increases to 453.3%. As a result, as illustrated in FIG. 22, when each accounts for 25% (operation rate of 50%), the average is 77.2%, which is lower than the circuit using the ENOR circuit. In addition, when the case in which the change of data is hardly detected as 0→0 is 97%, the value is lower at 72.7%. However, when the case in which the change of data is hardly detected as 1→1 is 97%, the value increases to 327.5%.

The circuit example 2 indicates the opposite feature with respect to the case of the circuit example 1. That is, with reference to FIG. 21, in the case of 1→1, 1→0, 0→1, the respective values indicate the power consumption of 78.8%, 74.5%, and 78.9% as compared with the ENOR circuit, which indicates lower consumption than in the case of the ENOR circuit (100%). However, in the case of 0→0, the value increases to 526.6%. As a result, as illustrated in FIG. 22, the average obtained when each case accounts for 25% (operation rate of 50%) is 85.3%, which is lower than the circuit using the ENOR circuit. In addition, when the case in which the change of data is hardly detected as 1→1 is 97%, the value is lower at 81.0%. However, when the case in which the change of data is hardly detected as 0→0 is 97%, the value increases to 368.5%. In addition, since the number of transistors has increased by 2 as compared with the circuit example 1, the power consumption is higher than in the case of the circuit example 1 (NOR).

Similarly, in the circuit example 3, with reference to FIG. 21, in the case of 0→0, 0→1, 1→0, the respective values indicate the power consumption of 76.5%, 60.6%, and 72.3% as compared with the ENOR circuit in FIG. 4, which indicates lower consumption than in the case of the ENOR circuit (100%). However, in the case of 1→1, the value increases to 435.3%. As a result, as illustrated in FIG. 22, the average obtained when each case accounts for 25% (operation rate of 50%) is 73.9%, which is lower than the circuit using the ENOR circuit. In addition, when the case in which the change of data is hardly detected as 0→0 or 1→1 is 97%, the respective values are 75.6% and 314.3.

In the circuit example 4, with reference to FIG. 21, in the case of 1→1, 1→0, 0→1, the respective values indicate the power consumption of 80.0%, 60.4%, and 63.0% as compared with the ENOR circuit, which indicates lower consumption than in the case of the ENOR circuit (100%). However, in the case of 0→0, the value increases to 499.5%. As a result, as illustrated in FIG. 22, the average obtained when each case accounts for 25% (operation rate of 50%) is 70.3%, which is lower than in the case in which the ENOR circuit is used. In addition, when the case in which the change of data is hardly detected as 0→0 or 1→1 is 97%, the respective values are 745.8% and 76.8.

Thus, in the circuit examples 3 and 4, the tendency is similar to that in the circuit example 1 or 2 basically. However, since the number of transistors is smaller, the power consumption is lower than in the circuit examples 1 and 2. In addition, when there is hardly any change of data, the power consumption can be almost the same as in the circuit example 1 in the case of 0→0 in the circuit example 3, and can be almost the same or lower than in the case of the circuit example 2 in the case of 1→1 in the circuit example 4.

FIG. 23 is a set of the measurement results of the leakage power of the circuit examples 1 through 4 and the circuits in FIGS. 1 and 4. The leakage power refers to the power consumption when a clock and data do not change. That is, for example, "<1> D=0, M=0" in FIG. 23 refers to the power measured immediately before the signal of L is input to the clock input terminal when the input data is 0 and the output data is 0 in the circuit. ("Immediately before" refers to the timing before a signal is input.) Similarly, "<2> D=1, M=0" refers to the power measured immediately before the signal of L is input to the clock input terminal when the input data is 1 and the output data is 0 in the circuit. The same holds true with <3> and <4>.

The averaged power of the measurement power of each circuit in the cases of <1> through <4> is described in the rightmost column in FIG. 23. In this case, when the leakage power of the circuit illustrated in FIG. 4 (the case in which the ENOR circuit is used) is 100%, the average leakage power of the circuit examples 1 through 4 is respectively 69.6%, 90.5%, 67.4%, and 72.6%. Since the leakage power is subject to the influences of the topology of a circuit and the number of transistors, it is not generally described, but the leakage power in the case in which the ENOR circuit is used is 100% as the highest value. Thus, the circuit examples 1 through 4 can minimize the leakage power as compared with the case in which the ENOR circuit is used.

As described above, according to the disclosed circuit examples 1 through 4, the power consumption during the operation and the leakage power can be lower than that by the conventional circuit. For more detail, from the power measurement result in FIG. 21, the circuit according to the circuit example 1 or 3 is used in the circuit having a higher probability that the latch value indicates L (0), and the circuit according to the circuit example 2 or 4 is used in the circuit having a higher probability that the latch value indicates H (1), thereby reducing the power consumption. In many cases, since the number of transistors to be used is smaller in the circuit examples 3 and 4 than in the circuit examples 1 and 2, it can be said that they excel in downsizing and power-saving. However, the circuit examples 1 and 2 has the feature that the circuit size and the power consumption can be reduced more than the case in which a conventional ENOR circuit is used (FIG. 4) by using a external circuit such as the NOR circuit and the AND circuit without changing the configuration of the conventional latch circuit such as an IH latch circuit illustrated in FIG. 1 etc. That is, when the circuit size and the power consumption are to be reduced using the conventional latch circuit, it is effective to use the embodiment 1, and the embodiment 2 is to be used when the size of a circuit is further reduced and the power consumption is further decreased.

Although the embodiments of the present invention have been described above in detail, the circuit of the portion for controlling the internal clock propagation can be simplified and the circuit size can be minimized according to the disclosed latch circuit.

It is obvious that the present invention is not limited to the descriptions of the above-mentioned embodiments, and a number of variations and modifications can be made within the range of the gist of the present invention.

That is, all examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A latch circuit, comprising:
   a latch unit that holds and output input data of 0 or 1; and
   a clock propagation suppressing unit that compares input data input to the latch unit with output data output from the latch unit, and prevent a clock signal externally input from propagating to the latch unit when it is detected that the data match at 0, or prevent a clock signal externally input from propagating to the latch unit when it is detected that the data match at 1, wherein,
   the clock propagation suppressing unit compares the input data input to the latch unit with the output data output from the latch unit, and suppresses the clock signal externally input from propagating to the latch unit when it is detected that the data match at 0,
   the latch circuit includes
      a first P type transistor in which a source terminal is connected to a high-voltage side power supply terminal, and data obtained by inverting the input data is input to a gate terminal,
      a second P type transistor in which a source terminal is connected to the high-voltage side power supply terminal, and data obtained by inverting the output data is input to a gate terminal,
      a third P type transistor in which a source terminal is connected to drain terminals of the first P type transistor and the second P type transistor, and the clock is input to a gate terminal,
      a first N type transistor in which a source terminal is connected to a low-voltage side power supply terminal, the clock is input to a gate terminal, and a drain terminal is connected to a drain terminal of the third P type transistor,
      a second N type transistor in which a source terminal is connected to the low-voltage side power supply terminal, and data obtained by inverting the output data is input to a gate terminal, and
      a third N type transistor in which a source terminal is connected to a drain terminal of the second N type transistor, and data obtained by inverting the input data is input to a gate terminal, and
   a signal indicating potential of a connection point of the drain terminal of the first N type transistor and a drain terminal of the third N type transistor is input as a clock to the latch unit.

2. A latch circuit, comprising:
   a latch unit that holds and output input data of 0 or 1; and
   a clock propagation suppressing unit that compares input data input to the latch unit with output data output from the latch unit, and prevent a clock signal externally input from propagating to the latch unit when it is detected that the data match at 0, or prevent a clock signal externally input from propagating to the latch unit when it is detected that the data match at 1, wherein,
   the clock propagation suppressing unit compares the input data input to the latch unit with the output data output from the latch unit, and suppresses the clock signal externally input from propagating to the latch unit when it is detected that the data match at 1,
   the latch circuit includes
      a first P type transistor in which a source terminal is connected to a high-voltage side power supply terminal, and the input data is input to a gate terminal,
      a second P type transistor in which a source terminal is connected to the high-voltage side power supply terminal, and the output data is input to a gate terminal,
      a third P type transistor in which a source terminal is connected to drain terminals of the first P type transistor and the second P type transistor, and the clock is input to a gate terminal,
      a first N type transistor in which a source terminal is connected to a low-voltage side power supply terminal, the clock is input to a gate terminal, and a drain terminal is connected to a drain terminal of the third P type transistor,
      a second N type transistor in which a source terminal is connected to the low-voltage side power supply terminal, and the output data is input to a gate terminal, and a third N type transistor in which a source terminal is connected to a drain terminal of the second N type transistor, and the input data is input to a gate terminal, and a signal indicating potential of a connection point of the drain terminal of the first N type transistor and a drain terminal of the third N type transistor is input as a clock to the latch unit.

3. A clock control circuit connected to a latch circuit which holds and outputs input data of 0 or 1, the clock control circuit comprising:

a clock propagation suppressing unit that compares input data input to the latch circuit with output data output from the latch circuit, and prevent a clock signal externally input from propagating to the latch circuit when it is detected that the data match at 0, or prevent a clock signal externally input from propagating to the latch circuit when it is detected that the data match at 1, wherein, the clock propagation suppressing unit compares the input data input to the latch circuit with the output data output from the latch circuit, and suppresses the clock signal externally input from propagating to the latch circuit when it is detected that the data match at 1, the clock control circuit includes a first P type transistor in which a source terminal is connected to a high-voltage side power supply terminal, and the input data is input to a gate terminal, a second P type transistor in which a source terminal is connected to the high-voltage side power supply terminal, and the output data is input to a gate terminal, a third P type transistor in which a source terminal is connected to drain terminals of the first P type transistor and the second P type transistor, and the clock is input to a gate terminal, a first N type transistor in which a source terminal is connected to a low-voltage side power supply terminal, the clock is input to a gate terminal, and a drain terminal is connected to a drain terminal of the third P type transistor, a second N type transistor in which a source terminal is connected to the low-voltage side power supply terminal, and the output data is input to a gate terminal, and a third N type transistor in which a source terminal is connected to a drain terminal of the second N type transistor, and the input data is input to a gate terminal, and a signal indicating potential of a connection point of a drain terminal of the first N type transistor and a drain terminal of the third N type transistor is input as a clock to the latch unit.

* * * * *